United States Patent
Kuijk et al.

(10) Patent No.: US 10,903,381 B2
(45) Date of Patent: Jan. 26, 2021

(54) ELECTRONIC DEVICE MODULE

(71) Applicant: YPAREX B.V., Enschede (NL)

(72) Inventors: Egbert Willem Kuijk, Geleen (NL); Erik Cornelis Bijleveld, Geleen (NL)

(73) Assignee: YPAREX B.V., Enschede (NL)

( * ) Notice: Subject to any disclaimer, the term of this patent is extended or adjusted under 35 U.S.C. 154(b) by 0 days.

(21) Appl. No.: 15/544,635

(22) PCT Filed: Jan. 21, 2016

(86) PCT No.: PCT/EP2016/051219
§ 371 (c)(1),
(2) Date: Jul. 19, 2017

(87) PCT Pub. No.: WO2016/116554
PCT Pub. Date: Jul. 28, 2016

(65) Prior Publication Data
US 2017/0373209 A1 Dec. 28, 2017

(30) Foreign Application Priority Data

Jan. 23, 2015 (EP) .................................... 15152369

(51) Int. Cl.
*H01L 31/048* (2014.01)
*B29C 48/21* (2019.01)
(Continued)

(52) U.S. Cl.
CPC ........ *H01L 31/0481* (2013.01); *B29C 48/022* (2019.02); *B29C 48/21* (2019.02);
(Continued)

(58) Field of Classification Search
CPC ... H01L 31/0481; B29C 48/022; B29C 48/21; B32B 17/10688; B32B 17/1055;
(Continued)

(56) References Cited

U.S. PATENT DOCUMENTS 3,862,107 A 1/1975 MacLeay
4,129,531 A 12/1978 Rauer et al.
(Continued)

FOREIGN PATENT DOCUMENTS

CN 102918659 A 2/2013
EP 2579331 A1 4/2013
(Continued)

OTHER PUBLICATIONS

Wild, L., et al, Determination of Branching Distributions in Polyethyylene and Ethylene Copolymers, Journal of Polymer Science, Poly. Phys. Ed., 1982, pp. 441-455, vol. 20, John Wiley & Sons, Inc.
(Continued)

*Primary Examiner* — Jayne L Mershon
(74) *Attorney, Agent, or Firm* — Hudak, Shunk & Farine Co. LPA

(57) ABSTRACT

An electronic device module including a glass cover sheet, a polymeric front polymeric material, an electronic device, a polymeric back material and a backsheet, wherein the polymeric front and/or back materials have a trilayer structure including a back layer which is adhered to a surface of the electronic device, a front layer which is adhered to the glass cover sheet or the backsheet and an intermediate layer between the back layer and the front layer, wherein each of the back layer and the front layer includes an ethylene interpolymer grafted with silane, wherein the ethylene interpolymer grafted with silane has a density of at most 0.905 g/cm³, and the intermediate layer is a non-grafted ethylene interpolymer having a density of at most 0.905 g/cm³, which is crosslinked with the aid of a crosslinking initiator and optionally a crosslinking coagent, and optionally additives. A trilayer polymeric film having outer layers including
(Continued)

ethylene interpolymers grafted with silanes and a non-grafted innerlayer containing a peroxide and UV stabilizer.

9 Claims, 1 Drawing Sheet

(51) Int. Cl.
  *B29C 48/00* (2019.01)
  *B32B 27/32* (2006.01)
  *B32B 17/10* (2006.01)
  *B32B 37/15* (2006.01)
  *B29L 7/00* (2006.01)
  *B29L 9/00* (2006.01)

(52) U.S. Cl.
  CPC .... *B32B 17/10018* (2013.01); *B32B 17/1055* (2013.01); *B32B 17/10688* (2013.01); *B32B 27/327* (2013.01); *B29K 2023/04* (2013.01); *B29L 2007/008* (2013.01); *B29L 2009/00* (2013.01); *B32B 37/153* (2013.01); *B32B 2307/412* (2013.01); *B32B 2315/08* (2013.01); *B32B 2457/12* (2013.01); *Y02E 10/50* (2013.01)

(58) Field of Classification Search
  CPC ............ B32B 17/10018; B32B 27/327; B32B 2457/12; B32B 2315/08; B32B 2307/412; B32B 37/153; B29L 2009/00; B29L 2007/008; B29K 2023/04; Y02E 10/50
  See application file for complete search history.

(56) References Cited

U.S. PATENT DOCUMENTS

| | | |
|---|---|---|
| 4,798,081 A | 1/1989 | Hazlitt et al. |
| 5,008,204 A | 4/1991 | Stehling |
| 5,266,627 A | 11/1993 | Meverden et al. |
| 5,272,236 A | 12/1993 | Lai et al. |
| 5,278,272 A | 1/1994 | Lai et al. |
| 5,783,638 A | 7/1998 | Lai et al. |
| 5,986,028 A | 11/1999 | Lai et al. |
| 6,586,271 B2 | 7/2003 | Hanoka |
| 2001/0045229 A1 | 11/2001 | Komori et al. |
| 2008/0023064 A1 | 1/2008 | Hayes et al. |
| 2013/0174907 A1* | 7/2013 | Murasawa ............ B32B 27/327 136/259 |
| 2014/0360560 A1* | 12/2014 | Taniguchi ............ H01L 31/0481 136/251 |

FOREIGN PATENT DOCUMENTS

| | | |
|---|---|---|
| EP | 2804223 A1 | 11/2014 |
| JP | 2004241391 A | 8/2004 |
| JP | 2010504647 A | 2/2010 |
| JP | 2014241391 A | 12/2014 |
| JP | 2015-70044 A | 4/2015 |
| KR | 101289234 B1 | 7/2013 |
| WO | 9904971 A2 | 2/1999 |
| WO | 9905206 A2 | 2/1999 |
| WO | 2008036708 A1 | 3/2008 |
| WO | 2011153541 A1 | 12/2011 |
| WO | WO-2013105616 A1 * | 7/2013 ......... H01L 31/0481 |

OTHER PUBLICATIONS

Park, C.P., Polyolefin Foam, Handbook of Polymer Foams and Technology, 1991, pp. 198-204, Chapter 9, Hanser Publishers, Munich.

Encyclopedia of Chemical Technology, Peroxides and Peroxy Compounds, Organic, 1982, pp. 27-90, 3rd Edition, vol. 17.

Randall, J., et al., A Review of High Resolution Liquid 13Carbon Nuclear Magnetic Resonance Characterizaitons of Ethylene-Based Polymers, 1989, pp. 201-317, JMS, Rev. Macromol. Chem. Phys., C29(2 and 3), Marcel Dekker, Inc.

Japanese Office Action dated Oct. 28, 2019 for family member application.

Japanese Office Action dated Jun. 2, 2020 for family member Application No. 2017-557257.

* cited by examiner

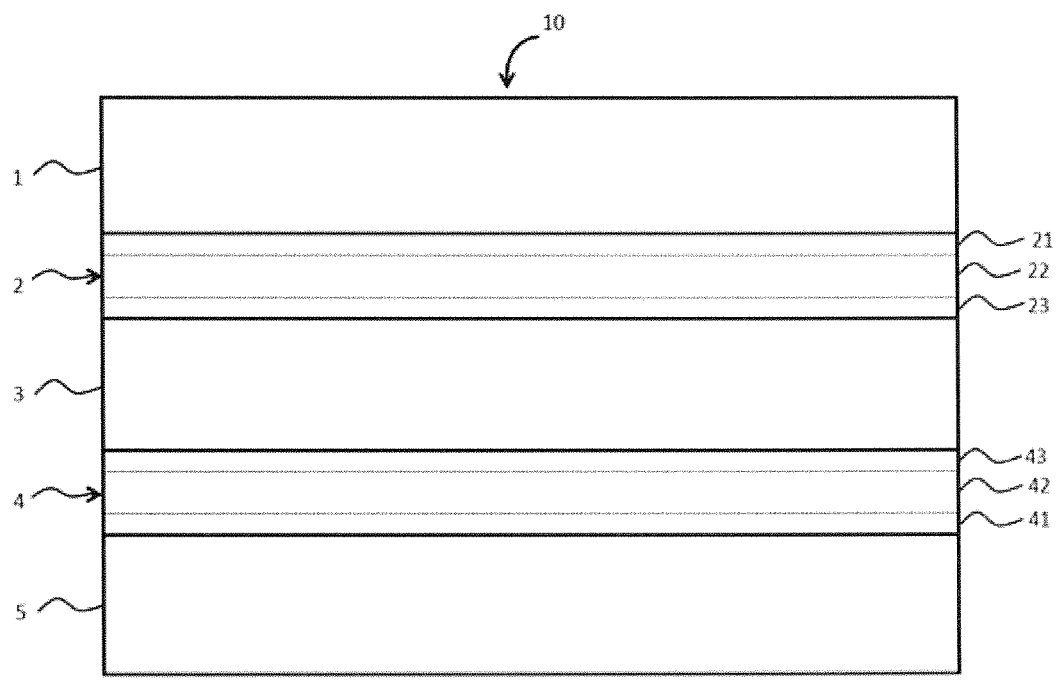

ELECTRONIC DEVICE MODULE

FIELD OF THE INVENTION

The invention relates to electronic device modules. In particular, the invention relates to electronic device modules comprising an electronic device, e.g., a solar or photovoltaic (PV) cell and a protective polymeric material.

BACKGROUND OF THE INVENTION

Polymeric materials are commonly used in the manufacture of modules comprising one or more electronic devices including, but not limited to, solar cells (also known as photovoltaic cells), liquid crystal panels, electro-luminescent devices and plasma display units. The modules often comprise an electronic device in combination with one or more substrates, e.g., one or more glass cover sheets, often positioned between two substrates in which one or both of the substrates comprise glass, metal, plastic, rubber or another material. The polymeric materials are typically used as the encapsulant for the module or, depending upon the design of the module, as a skin layer component of the module, e.g. a back sheet in a solar cell module. Typical polymeric materials for these purposes include silicone resins, epoxy resins, polyvinyl butyral resins, cellulose acetate, ethylene-vinyl acetate copolymer (EVA) and ionomers.

Especially EVA is used in these applications. EVA has a number of shortcomings. Due to aging the color of the encapsulant turns yellow, and corrosive materials (like acetic acid) are being formed which may affect the photovoltaic cells and/or the construction of the device modules.

WO2011/153541 discloses an electronic device module comprising at least one electronic device and a polymeric material in intimate contact with at least one surface of the electronic device. The polymeric material comprises an ethylene interpolymer which may be very low density polyethylene (VLDPE) and a grafted silane. In one embodiment, the polymeric material is a co-extruded material in which at least one outer skin layer (i) does not contain peroxide for crosslinking, and (ii) is the surface which comes into intimate contact with the module. This outer skin of the co-extruded material typically comprises the same polymer as the polymer of the core layer. In this embodiment, the core layer contains peroxide but the outer skin layer is without the peroxide.

EP 2 579 331 discloses a sealing material for solar cell modules, wherein a polyethylene based resin is used having a MFR between 0.1 g/min and 1.0 g/min.

EP 2 804 223 discloses a solar cell module having excellent appearance.

SUMMARY OF THE INVENTION

It is an object of the invention to provide an electronic device module which is more efficient and cost-effective.

It is another objective to provide a device module comprising a polymeric material which has high optical clarity, good adhesion to glass, to the surface of an electronic device, and optionally to a back sheet in the module and which polymeric material has improved stability.

It is another objective to provide a device module comprising a polymeric material which is stable against creep and can ensure long lifetimes of the device module.

This objective is achieved by an electronic device module comprising a glass cover sheet 1, a polymeric front material 2, an electronic device 3, a polymeric back material 4 and a backsheet 5, wherein the polymeric front and/or back materials have a trilayer structure comprising a back layer 23, 43 which is adhered to a surface of the electronic device 3, a front layer 21, 41 which is adhered to the glass cover sheet 1 or the backsheet 5 and an intermediate layer 22, 42 between the back layer and the front layer, wherein each of the back layer and the front layer comprises an ethylene interpolymer grafted with silane, wherein the ethylene interpolymer grafted with silane has a density of at most 0.905 g/cm³, and the intermediate layer consists of a non-grafted ethylene interpolymer having a density of at most 0.905 g/cm³, which is crosslinked with the aid of a crosslinking initiator and optionally a crosslinking coagent, a UV stabilizer and optionally one or more additives.

The present invention has the advantage that a high percentage of the chains in the polymeric front material and polymeric back material comprise silane, leading to a high adhesive strength to the substrate. Preferably the polymeric front and back material have a high melt flow rate (MFR) which increases the mobility of the polymer, leading to a high adhesion in short time.

Also the high MFR leads to a very easy and fast process for making the film for the electronic device module.

According to the invention, only the back layer and the front layer, i.e. the surfaces of the polymeric material which come into contact with the electronic device or the glass cover sheet, comprise a grafted ethylene interpolymer. The intermediate layer which constitutes the large bulk of the polymeric material is non-grafted. The fact that the intermediate layer does not have to be grafted allows a more efficient production process for the polymeric material and the electronic device module comprising the polymeric material. Furthermore, a major part of the expensive grafted polymer can be replaced by a less expensive non-grafted polymer, which is cost effective.

The term "interpolymer" refers to polymers prepared by the polymerization of at least two different types of monomers. The generic term interpolymer includes copolymers, usually employed to refer to polymers prepared from two different monomers, and polymers prepared from more than two different types of monomers.

The term "ethylene-based polymer" refers to a polymer that contains more than 50 mole percent polymerized ethylene monomer (based on the total amount of polymerizable monomers) and, optionally, may contain at least one comonomer.

The term "ethylene/α-olefin interpolymer" refers to an interpolymer that contains more than 50 mole percent polymerized ethylene monomer (based on the total amount of polymerizable monomers) and at least one α-olefin. Examples of α-olefins are propylene, 1-butene, 1-hexene, 1-octene and 1-decene.

The term "ethylenic polymer" refers to a polymer resulting from the bonding of an ethylene-based polymer and at least one highly long chain branched ethylene-based polymer.

The electronic device module comprises a glass cover sheet 1, a polymeric front material 2, an electronic device 3, a polymeric back material 4 and a backsheet 5. The module can further comprise one or more other components; for example an anti-fouling coating or a protective coating.

The glass cover sheet forms the top sheet of the electronic device module. The glass cover sheet preferably is fully transparent for light. Preferably, non-colored types of glass are used. The glass cover sheet can be flat glass or structured glass. Preferably, the glass cover sheet is flat glass.

The glass cover sheet protects the electronic device module, for example from weather influences. The thickness of the glass cover sheet can be chosen by the man skilled in the art dependent on the place where the electronic device module will be used. A typical thickness for the glass cover sheet is in the range of about 0.125 to about 1.25 mm.

The glass cover sheet in the electronic device module is adhered to the polymeric front material.

The electronic device modules comprise an electronic device which is positioned between the polymeric front material and the polymeric back material. Examples of electronic devices are solar cells (also known as photovoltaic elements), liquid crystal panels, electro-luminescent devices and plasma display units.

Preferably, the electronic device module comprises a photovoltaic element. A photovoltaic element (solar cell) converts light directly into electricity by the photovoltaic effect. Solar cells are the building blocks of photovoltaic modules, otherwise known as solar panels. The photovoltaic element can be rigid or flexible.

The electronic device can be fully encapsulated in the polymeric material, or the polymeric material can be in intimate contact with only a portion of the electronic device, e.g., laminated to one face surface of the electronic device.

The backsheet of the electronic device module can be a second glass cover sheet or another substrate of any kind that supports the rear surface of the polymeric back material that is present between the rear surface of the electronic device and the backsheet. The backsheet does not need not be transparent if the surface of the electronic device to which it is opposed is not reactive to sunlight. The thickness of the backsheet is not critical to this invention and as such, can vary widely depending upon the overall design and purpose of the module. A typical thickness for the backsheet is in the range of about 0.125 to about 1.25 mm.

The polymeric front material has a trilayer structure comprising a back layer which is adhered to a surface of the electronic device, a front layer which is adhered to a surface of the glass cover sheet and an intermediate layer between the back layer and the front layer.

The polymeric back material has a trilayer structure comprising a back layer which is adhered to a surface of the electronic device, a front layer which is adhered to a surface of the back sheet and an intermediate layer between the back layer and the front layer.

As used herein, the term 'trilayer structure' is understood to mean a structure having three layers attached to each other with their surfaces. The trilayer structure comprises a back layer, a front layer and an intermediate layer between the back layer and the front layer.

The polymeric material is located between the electronic device and the glass cover sheet or the back sheet in a sandwich configuration. If the polymeric material is applied as a film to the surface of the glass cover sheet opposite the electronic device, then the surface of the film that is in contact with that surface of the glass cover sheet can be smooth or uneven, e.g., embossed or textured.

In the polymeric material having a trilayer structure each of the back layer and the front layer comprise an ethylene interpolymer grafted with silanes, wherein the ethylene interpolymer grafted with silane has a density of at most 0.905 g/cm$^3$.

The intermediate layer comprises a non-grafted ethylene interpolymer having a density of at most 0.905 g/cm$^3$, and is crosslinked with the aid of a crosslinking initiator and optionally a crosslinking coagent.

Preferably, the density of the back layer, front layer and intermediate layer is at most 0.895 g/cm$^3$, preferably at most 0.890 g/cm$^3$, most preferably at most 0.885 g/cm$^3$, but more than 0.850 g/cm$^3$, preferably at least 0.855 g/cm$^3$, most preferably at least 0.860 g/cm$^3$.

Preferably, the trilayer polymeric material comprises 40-90 vol %, preferably 70-90 vol %, of the intermediate layer and 10-60 vol %, preferably 10-30 vol %, of the total of the back layer and the front layer. Preferably, each of the back layer and the front layer is 5-30 vol %, preferably 5-15 vol %, of the polymeric material.

Preferably, the polymeric material has a thickness of 100-1000 μm, preferably 150-800 μm, more preferably 200-600 μm. Preferably, each of the back layer and the front layer has a thickness of 5-200 μm, more preferably 10-100 μm, more preferably 20-80 μm. The thickness of the back layer and the front layer may be the same or different. Preferably, the intermediate layer has a thickness of 40-800 μm, more preferably 100-600 μm, more preferably 200-500 μm. In particularly preferred embodiments, the polymeric material has a thickness of 100-600 μm and the polymeric material comprises 40-90 vol %, preferably 50-85 vol %, more preferably 60-80 vol %, of the intermediate layer and each of the back layer and the front layer is 5-30 vol %, preferably 7.5-25 vol %, more preferably 10-20 vol %, of the polymeric material.

Each of the back layer and the front layer of the trilayer structure comprise an ethylene interpolymer grafted with a silane.

The ethylene interpolymers useful in the practice of this invention, also referred to as polyolefin copolymers, and as will be described further in more specific detail below, generally have a density of at most 0.905 g/cm$^3$, preferably at most 0.89 g/cm$^3$, more preferably at most 0.885 g/cm$^3$, even more preferably at most 0.88 g/cm$^3$ and even more preferably 0.875 g/cm$^3$. The polyolefin copolymers typically have a density greater than 0.85 g/cm$^3$, and more preferably greater than 0.86 g/cm$^3$. Very low density polyolefin copolymers are generally characterized as amorphous, flexible and having good optical properties, e.g. high transmission of visible and UV-light and low haze.

The ethylene interpolymer grafted with silane comprised in the front layer and the back layer has preferably a melt index (ASTM D-1238 (190° C./2.16 kg)) of 10-35 dg/min, preferably 15-32 dg/min.

The polyolefin copolymers useful in the practice of this invention preferably have a 2 percent secant modulus of less than 150 MPa, more preferably less than 140 MPa, most preferably less than 120 MPa, for example less than 100 MPa as measured by the procedure of ASTM D-882-02. The polyolefin copolymers typically have a 2 percent secant modulus of greater than zero, but the lower the modulus, the better the copolymer is adapted for use in this invention. The secant modulus is the slope of a line from the origin of a stress-strain diagram and intersecting the curve at a point of interest, and it is used to describe the stiffness of a material in the inelastic region of the diagram. Low modulus polyolefin copolymers are particularly well adapted for use in this invention because they provide stability under stress, e.g., less prone to crack upon stress or shrinkage.

The polyolefin copolymers useful in the practice of this invention and that are made with a single site catalyst such as a metallocene catalyst or constrained geometry catalyst, typically have a melting point of less than 95° C., preferably less than 90° C., more preferably less than 85° C., even more preferably less than 80° C. and still more preferably less than 75° C. For polyolefin copolymers made with multi-site catalysts, e.g., Ziegler-Natta and Phillips catalysts, the melting point is typically less than 125° C., preferably less than 120° C., more preferably less than 115° C. and even more preferably less than 110° C., degrees centigrade. The melting point is measured by differential scanning calorimetry (DSC) as described, for example, in U.S. Pat. No. 5,783,638. Polyolefin copolymers with a low melting point often exhibit desirable flexibility and thermoplasticity properties useful in the fabrication of the modules of this invention.

The polyolefin copolymers that can be used include ethylene/α-olefin interpolymers having an α-olefin content of between 15 wt %, preferably at least 20 wt % and even more preferably at least 25 wt %, based on the weight of the ethylene interpolymer. These ethylene interpolymers typically have an α-olefin content of less than 50 wt %, preferably less than 45 wt %, more preferably less than 40 wt % and even more preferably less than 35 wt %, based on the weight of the interpolymer. The α-olefin content is measured by $^{13}$C nuclear magnetic resonance (NMR) spectroscopy using the procedure described in Randall (Rev. Macromol. Chem. Phys., C29 (2 and 3)). Generally, the greater the α-olefin content of the ethylene interpolymer, the lower the density and the more amorphous the ethylene interpolymer, and this translates into desirable physical and chemical properties for the protective polymer component of the module.

The α-olefin is preferably a C3-20 linear, branched or cyclic α-olefin. The term interpolymer refers to a polymer made from at least two monomers. It includes, for example, copolymers, terpolymers and tetrapolymers. Examples of C3-20 α-olefins include propene, 1-butene, 4-methyl-1-pentene, 1-hexene, 1-octene, 1-decene, 1-dodecene, 1-tetradecene, 1-hexadecene and 1-octadecene. The α-olefins can also contain a cyclic structure such as cyclohexane or cyclopentane, resulting in an α-olefin such as 3-cyclohexyl-1-propene (allyl cyclohexane) and vinyl cyclohexane. Although not α-olefins in the classical sense of the term, for purposes of this invention certain cyclic olefins, such as norbornene and related olefins, are α-olefins and can be used in place of some or all of the α-olefins described above. Similarly, styrene and its related olefins (for example, -α-methylstyrene.) are α-olefins for purposes of this invention. Acrylic and methacrylic acid and their respective ionomers, and acrylates and methacrylates, however, are not α-olefins for purposes of this invention. Illustrative polyolefin copolymers include ethylene/propylene, ethylene/butene, ethylene/1-hexene, ethylene/1-octene, ethylene/styrene, and the like. Ethylene/acrylic acid (EAA), ethylene/methacrylic acid (EMA), ethylene/acrylate or methacrylate, ethylene/vinyl acetate and the like are not polyolefin copolymers of this invention. Illustrative terpolymers include ethylene/propylene/1-octene, ethylene/propylene/butene, ethylene/butene/1-octene, and ethylene/butene/styrene. The copolymers can be random copolymers or block copolymers.

More specific examples of the types of ethylene interpolymers useful in this invention include very low density polyethylene (VLDPE) (e.g., FLEXOMER® ethylene/hexene polyethylene made by The Dow Chemical Company), homogeneously branched, linear ethylene/α-olefin copolymers (e.g. TAFMER® by Mitsui Petrochemicals Company Limited, Queo® by Borealis and EXACT® by Exxon Chemical Company), and homogeneously branched, substantially linear ethylene/α-olefin copolymers (e.g., AFFINITY® and ENGAGE® polyethylene available from The Dow Chemical Company) as will be described in more detail below. The more preferred ethylene interpolymers are very low density polyethylene (VLDPE), homogeneously branched, linear ethylene/α-olefin copolymer or homogeneously branched, substantially linear ethylene/α-olefin copolymer.

Substantially linear ethylene/α-olefin copolymers are for example described in U.S. Pat. Nos. 5,272,236, 5,278,272 and 5,986,028.

More preferred, the ethylene interpolymers are very low density polyethylene (VLDPE).

Blends of any of the above ethylene interpolymers can also be used in this invention, and the ethylene interpolymers can be blended or diluted with one or more other polymers to the extent that the polymers are (i) miscible with one another, (ii) the other polymers have little, if any, impact on the desirable properties of the polyolefin copolymer, e.g., optics and low modulus, and (iii) the polyolefin copolymers of this invention constitute at least 70 wt %, preferably at least 75 wt % and more preferably at least 80 wt %, of the blend. The polyolefin copolymers useful in the practice of this invention have a Tg of less than −35° C., preferably less than −40° C., more preferably less than −45° C., and even more preferably less than −50° C., as measured by differential scanning calorimetry (DSC) using the procedure of ASTM D-3418-03. Moreover, typically the polyolefin copolymers used in the practice of this invention also have a melt index MI as measured by the procedure of ASTM D-1238 (190° C./2.16 kg) of less than 100 g/10 minutes, preferably less than 75 g/10 minutes, more preferably less than 50 g/10 minutes and even more preferably less than 35 g/10 minutes. The typical minimum MI is 1 g/10 minutes, and more typically it is 5 g/10 minutes.

The ethylene interpolymers useful in the practice of this invention can have an SCBDI (Short Chain Branch Distribution Index) or CDBI (Composition Distribution Branch Index) defined as the weight percent of the polymer molecules having comonomer content within 50 percent of the median total molar comonomer content. The CDBI of a polymer is readily calculated from data obtained from techniques known in the art, such as, for example, temperature rising elution fractionation (abbreviated herein as "TREF") as described, for example, in Wild et al, Journal of Polymer Science, Poly. Phys. Ed., Vol. 20, p. 441 (1982), or as described in U.S. Pat. Nos. 4,798,081 and 5,008,204. The SCBDI or CDBI for the ethylene interpolymers used in the practice of this present invention is typically greater than 50%, preferably greater than 60%, more preferably greater than 70%, even more preferably greater than 80%, and most preferably greater than 90%.

Due to the low density and modulus of the ethylene interpolymers used in the practice of this invention, these interpolymers are typically cured or crosslinked at the time of contact or after, usually shortly after, the electronic device module has been constructed. Crosslinking is important to the performance of the interpolymer in its function to protect the electronic device from the environment. Specifically, crosslinking enhances the thermal creep resistance of the interpolymer and durability of the electronic device module in terms of heat, impact and solvent resistance. Crosslinking can be effected by any one of a number of different methods, e.g., by the use of thermally activated initiators, e.g., peroxides and azo compounds; photoinitiators, e.g., benzophenone; radiation techniques including sunlight, UV light, E-beam and x-ray; silane, e.g., vinyl tri-ethoxy or vinyl tri-methoxy silane; and moisture curing.

As mentioned above, an ethylene interpolymer grafted with silane is employed in the electronic device module according to the present invention. The silane can be any silane that will effectively crosslink the polyolefin copolymer and provide enhanced adhesion.

Suitable silanes include unsaturated silanes that comprise an ethylenically unsaturated hydrocarbyl group, such as a vinyl, allyl, isopropenyl, butenyl, cyclohexenyl or (meth) acryloxy allyl group, and a hydrolyzable group, such as, for example, a hydrocarbyloxy, hydrocarbonyloxy, or hydrocarbylamino group. Examples of hydrolyzable groups include methoxy, ethoxy, formyloxy, acetoxy, proprionyloxy, and alkyl or arylamino groups. Preferred silanes are the unsaturated alkoxy silanes which can be grafted onto the polymer. These silanes and their method of preparation are more fully described in U.S. Pat. No. 5,266,627. Vinyl trimethoxy silane, vinyl triethoxy silane, (-(meth)acryloxy propyl) trimethoxy silane and mixtures of these silanes are the preferred silanes for use in this invention. If filler is present, then preferably the silane includes vinyl triethoxy silane.

A grafted silane is made as described below, by subjecting the polyolefin copolymer or ethylene copolymer to grafting processes or techniques in which at least a part of the copolymer is provided with the grafted silane. As known to practitioners in this area, the vinyl or unsaturated silanes employed in this fashion, after grafting and becoming grafted to a polymer, including the polyolefin copolymer, are no longer technically "vinyl" silanes in that they are no longer unsaturated but are still sometimes referred to as grafted vinyl silanes based on being derived from and remnants of vinyl silanes. In another embodiment a separate, compatible silane grafted polymer is made and added to polyolefin copolymer of the polymeric material.

The amount of silane used in the practice of this invention can vary widely depending upon the nature of the polyolefin copolymer, the silane, the processing conditions, the grafting efficiency, the ultimate application, and similar factors, but typically at least 0.5, preferably at least 0.7, wt % is used relative to the weight of the copolymer. Considerations of convenience and economy are usually the two principal limitations on the maximum amount of silane used in the practice of this invention, and typically the maximum amount of silane does not exceed 10 wt %, preferably it does not exceed 5 wt % relative to the weight of the copolymer. The silane is grafted to the polyolefin copolymer by any conventional method, typically in the presence of a free radical initiator e.g. peroxides and azo compounds, or by ionizing radiation, etc. These are discussed in more detail below.

Organic free radical initiators are preferred, such as any of those described above, e.g., the peroxide and azo initiators. The amount of initiator can vary, but it is typically present in the amounts described below.

While any conventional method can be used to graft the silane to the polyolefin copolymer, one preferred method is blending the two with the initiator in the first stage of a reactor extruder, such as a Buss kneader. The grafting conditions can vary, but the melt temperatures are typically between 180 and 350° C., preferably between 250 and 320° C., depending upon the residence time and the half-life of the initiator.

The half life time of the free radical initiator for crosslinking purposes at 110° C. is preferably >1 hour. The half life time of the free radical initiator for crosslinking purposes at 160° C. is preferably <6 minutes.

The free radical initiators used in the practice of this invention to graft silane and/or crosslink the polyolefin copolymers include any thermally activated compound that is relatively unstable and easily breaks into at least two radicals. Representative of this class of compounds are the peroxides, particularly the organic peroxides, and the azo initiators. Of the free radical initiators used as crosslinking agents, the dialkyl peroxides and diperoxyketal initiators are preferred. These compounds are described, for example, in the Encyclopedia of Chemical Technology, 3rd edition, Vol. 17, pp 27-90. (1982).

In the group of dialkyl peroxides, the preferred initiators are: dicumyl peroxide, t-butyl cumyl peroxide, 2,5-dimethyl-2,5-di(t-butylperoxy)-hexane, 2,5-dimethyl-2,5-di(t-amylperoxy)-hexane, di[(t-butylperoxy)-isopropyl]-benzene, di-t-amyl peroxide, 1,3,5-tri-[(t-butylperoxy)-isopropyl]benzene, 1,3-dimethyl-3-(t-butylperoxy)butanol, 1,3-dimethyl-3-(t-amylperoxy)butanol and mixtures of two or more of these initiators.

In the group of diperoxyketal initiators, the preferred initiators are: 1,1-di(t-butylperoxy)cyclohexane n-butyl, 4,4-di(t-amylperoxy)valerate, 2,2-di(t-amylperoxy)propane, n-butyl-4,4-bis(t-butylperoxy)-valerate and mixtures of two or more of these initiators. Other peroxide initiators, e.g., mono-t-butyl-peroxysuccinate; mono-1-pentyl-peroxysuccinate and/or azo initiators e.g., 2,2'-azobis-(2-acetoxypropane), may also be used to provide a crosslinked polymer matrix. Other suitable azo compounds include those described in U.S. Pat. Nos. 3,862,107 and 4,129,531. Mixtures of two or more free radical initiators may also be used together as the initiator within the scope of this invention. In addition, free radicals can form from shear energy, heat or radiation.

Preferred free radical initiators are chosen from the group consisting of cyclic peroxides and peroxycarbonates. For grafting most preferably 3,3,5,7,7,pentamethyl-1,2,4-trioxepane is chosen. For crosslinking purposes most preferably tert-butylperoxy-2-ethylhexyl carbonate is chosen.

The amount of peroxide or azo initiator present in the crosslinkable compositions of this invention can vary widely, but the minimum amount is that sufficient to afford the desired range of crosslinking. The minimum amount of initiator is typically at least 0.05 wt %, preferably at least 0.1 wt % and more preferably at least 0.25 wt %, based upon the weight of the polymer or polymers to be crosslinked. The maximum amount of initiator used in these compositions can vary widely, and it is typically determined by such factors as cost, efficiency and degree of desired crosslinking desired. The maximum amount is typically less than 10 wt %, preferably less than 5 wt % and more preferably less than 3 wt % based upon the weight of the polymer or polymers to be crosslinked.

Free radical crosslinking initiation via electromagnetic radiation, e.g., sunlight, ultraviolet (UV) light, infrared (IR) radiation, electron beam, beta-ray, gamma-ray, x-ray and neutron rays, may also be employed. Radiation is believed to affect crosslinking by generating polymer radicals, which may combine and crosslink. C. P. Park, "Polyolefin Foam", Chapter 9 of Handbook of Polymer Foams and Technology, edited by D. Klempner and K. C. Frisch, Hanser Publishers, pp. 198-204, Munich (1991), provides additional teachings. Elemental sulfur may be used as a crosslinking agent for diene containing polymers such as EPDM and polybutadiene. The amount of radiation used to cure the copolymer will vary with the chemical composition of the copolymer, the composition and amount of initiator, if any, the nature of the radiation, and the like, but a typical amount of UV light is at least 0.05 Joules/cm$^2$, more typically at 0.1 Joules/cm$^2$ and even more typically at least 0.5 Joules/cm$^2$, and a typical amount of E-beam radiation is at least 0.5 megarad, more typically at least 1 megarad and even more typically at least 1.5, megarad.

If sunlight or UV light is used to effect cure or crosslinking, then typically and preferably one or more photoinitiators are employed. Such photoinitiators include organic carbonyl compounds such as such as benzophenone, benzanthrone, benzoin and alkyl ethers thereof, 2,2-diethoxyacetophenone, 2,2-dimethoxy, 2 phenylacetophenone, p-phenoxy dichloroacetophenone, 2-hydroxycyclohexylphenone, 2-hydroxyisopropylphenone, and 1-phenylpropanedione-2-(ethoxy carboxyl) oxime. These initiators are used in known manners and in known quantities, e.g., typically at least 0.05 wt %, more typically at least 0.1 wt % and even more typically 0.5 wt % based on the weight of the copolymer.

If moisture, i.e., water, is used to effect curing or crosslinking, then typically and preferably one or more hydrolysis/condensation catalysts are employed. Such catalysts include Lewis acids such as dibutyltin dilaurate, dioctyltin dilaurate, stannous octonoate, and hydrogen sulfonates such as sulfonic acid.

Free radical crosslinking coagents, i.e. promoters or co-initiators, include multifunctional vinyl monomers and polymers, triallyl isocyanurate, triallyl cyanurate and trimethylolpropane trimethacrylate, divinyl benzene, acrylates and methacrylates of polyols, allyl alcohol derivatives, and low molecular weight polybutadiene. Sulfur crosslinking promoters include benzothiazyl disulfide, 2-mercaptobenzothiazole, copper dimethyldithiocarbamate, dipentamethylene thiuram tetrasulfide, tetrabutylthiuram disulfide, tetramethylthiuram disulfide and tetramethylthiuram monosulfide.

Preferably, the coagent is triallyl cyanurate or triallyl isocyanurate.

These coagents are used in known amounts and known ways. The minimum amount of coagent is typically at least 0.05 wt %, preferably at least 0.1 wt % and more preferably at least 0.5 wt %, based upon the weight of the polymer or polymers to be crosslinked. The maximum amount of coagent used in these compositions can vary widely, and it is typically determined by such factors as cost, efficiency and degree of desired crosslinking desired. The maximum amount is typically less than 10 wt %, preferably less than 5 wt % and more preferably less than 3 wt %, wt percent based upon the weight of the polymer or polymers to be crosslinked.

The polymeric material comprises a UV stabilizer. The UV-stabilizers are useful in lowering the wavelength of electromagnetic radiation that can be absorbed by a PV module (e.g., to less than 360 nm), and include hindered phenols such as Cyasorb UV2908 and hindered amines such as Cyasorb UV 3529, Hostavin N30, Univil 4050, Univin 5050, Chimassorb UV 119, Chimassorb 944 LD, Tinuvin 622 LD and the like. The phosphorus compounds include phosphonites (PEPQ) and phosphites (Weston 399, TNPP, P-168 and Doverphos 9228). The UV-stabilizers include UV absorbers that can also be incorporated into the films to provide additional protection. Examples of absorbers can include but are not limited to benzophenone-type absorbers such as Cyasorb UV-531, Benzotriazole-type absorbers such as Cyasorb UV-5411, Triazine-type absorbers such as Cyasorb UV-1164, mixed triazine-type/hindered amine light stabilizers such as Cyasorb THT6460 and oxanalide-type absorbers such as Tinuvin 312. The amount of UV-stabilizer is typically from 0.1 to 0.8 wt %, and preferably from 0.2 to 0.5 wt % based on the weight of the copolymer.

All layers of the trilayer structure according to the invention can comprise a UV stabilizer, however preferably, the intermediate layer comprises a UV stabilizer. In a preferred embodiment the intermediate layer comprises from 0.1-0.8 wt % of a UV stabilizer, while the backlayer and frontlayer comprise less than 0.1 wt % of UV stabilizer, preferably no UV stabilizer. Low amounts of UV stabilizer of even absence of UV stabilizer in the polymeric front and polymeric back materials surprisingly results in improved adhesion of the polymers to the substrates.

The polymeric material may contain additives. Examples of additives are processing stabilizers, such as trivalent phosphorus compounds, scorch inhibitors, antioxidants (e.g., hindered phenolics) (e.g., Irganox® 1010 made by BASF), cling additives, e.g., PIB, anti-blocks, anti-slips, pigments, anti-stats, and fillers (clear if transparency is important to the application). In-process additives, e.g. calcium stearate, water, etc., may also be used. These and other potential additives are used in the manner and amount as is commonly known in the art.

The amount of additives ranges in general between 0 and 5 wt % based on the weight of the copolymer, or between 0.02 and 3 wt %.

The amount of processing stabilizer is typically from 0.02 to 0.5 wt %, and preferably from 0.05 to 0.15 wt % based on the weight of the copolymer.

The present invention also relates to a three layered polymeric film, comprising two outer layers and one intermediate layer, wherein each outer layer independently has a thickness between 5-200 μm and comprises an ethylene interpolymer, having a density ≤0.905 g/cm$^3$ and a MI (190° C., 2.16 kg) between 10-35 g/10 min, and wherein the ethylene interpolymer in each outerlayer has been grafted with 0.5-10 wt % of a silane, and wherein the outer layers comprise less than 0.1 wt % of a UV stabilizer and less than 0.05 wt % of a peroxide; wherein the intermediate layer has a thickness between 40-800 μm and comprises an ethylene interpolymer, having a density ≤0.905 g/cm$^3$ and a MI (190° C., 2.16 kg) between 10-35 g/10 min, wherein the ethylene interpolymer of the intermediate layer is not grafted with silane, and wherein the intermediate layer comprises between 0.05 and 10 wt % of a peroxide having a halflifetime at 110° C. of more than 1 hour and a halflifetime at 160° C. of less than 6 minutes and wherein the intermediate layer comprises between 0.1-0.8 wt % of a UV stabilizer.

Preferably the MI (190° C., 2.16 kg) of the layers ranges between 15-32.

Preferably the amount of grafted silane in the outer layers ranges between 0.7-5 wt %.

Preferably the amount of peroxide in the intermediate layer ranges between 0.25 and 3 wt %.

In a preferred embodiment of the present invention, at least 50 wt % of the outer layers of the polymeric film consist of the silane grafted ethylene interpolymer, more preferably at least 75 wt %, or at least 90, 95 or 99 wt % of the outer layers. Preferably at least 50 wt % of the intermediate layer consists of the non-grafted ethylene interpolymer, the peroxide and UV stabilizer, preferably at least 75, 90, 95 or 99 wt %.

The polymeric materials according to the present invention are prepared in a coextrusion process. Because of the preferred high melt flow rates, low extrusion temperatures can be applied, typically between 90 and 130° C., preferably between 92 and 120° C., or between 95 and 110° C. The process can be applied at high speed, at least 2 m/min extrusion speed, preferably between 5 and 20 m/min.

The polymeric materials of this invention are used to construct electronic device modules in the same manner and using the same amounts as the polymeric material materials known in the art, e.g., such as those taught in U.S. Pat. No. 6,586,271, US2001/0045229 A1, WO 99/05206 and WO 99/04971. These materials can be used as "skins" for the electronic device, i.e., applied to one or both face surfaces of the electronic device, or as an polymeric material in which the electronic device is totally enclosed within the material. Typically, the polymeric material is applied to the electronic device by one or more lamination techniques in which a layer of film formed from the polymeric material is applied first to one face surface of the electronic device, and then to the other face surface of the electronic device. In an alternative embodiment, the polymeric material can be extruded in molten form onto the electronic device and allowed to congeal on the electronic device. The polymeric materials of this invention exhibit good adhesion for the face surfaces of the electronic device.

In one preferred embodiment, the electronic device module comprises (i) at least one photovoltaic element, typically a plurality of such elements arrayed in a linear or planar pattern, (ii) at least one glass cover sheet, typically a glass cover sheet over both face surfaces of the photovoltaic element, and (iii) at least one polymeric material. The polymeric material is typically disposed between the glass cover sheet and the photovoltaic element, and the polymeric material exhibits good adhesion to both the photovoltaic element and the sheet. If the photovoltaic element requires access to specific forms of electromagnetic radiation, e.g., sunlight, infrared, ultra-violet, etc., then the polymeric material exhibits good, typically excellent, transparency for that radiation, e.g., transmission rates in excess of 90%, preferably in excess of 95% and even more preferably in excess of 97%, as measured by UV-VIS spectroscopy. The absorbance is measured in the wavelength range of 250-1200 nanometers. An alternative measure of transparency is the internal haze method of ASTM D-1003-00. If transparency is not a requirement for operation of the electronic device, then the polymeric material can contain opaque filler and/or pigment.

Although the invention has been described in detail for purposes of illustration, it is understood that such detail is solely for that purpose and variations can be made therein by those skilled in the art without departing from the spirit and scope of the invention as defined in the claims.

It is further noted that the invention relates to all possible combinations of features described herein, preferred in particular are those combinations of features that are present in the claims.

It is further noted that the term 'comprising' does not exclude the presence of other elements. However, it is also to be understood that a description on a product comprising certain components also discloses a product consisting of these components. Similarly, it is also to be understood that a description on a process comprising certain steps also discloses a process consisting of these steps.

The invention is now elucidated by way of the following examples, without however being limited thereto.

BRIEF DESCRIPTION OF THE DRAWINGS

FIG. 1 shows a schematic side view of the electronic device module according to the invention.

DETAILED DESCRIPTION OF THE INVENTION

FIG. 1 shows a device module having a glass cover sheet 1, which is adhered to a polymeric front material 2, an electronic device 3, a polymeric back material 4 and a backsheet 5. Electronic device 3 has a front layer which is directed to and aligned with the glass cover sheet 1 and a back layer which is directed to and aligned with the backsheet 5. At least one of the polymeric materials 2 or 4 have a trilayer structure, preferably both polymeric materials have a trilayer structure. Polymeric material 2 preferably comprises a back layer 23 which is adhered to the front surface of the electronic device 3, a front layer 21 which is adhered to the glass cover sheet 1 and an intermediate layer 22 between the back layer 23 and the front layer 21.

Polymeric material 4 preferably comprises a back layer 43 which is adhered to the back surface of the electronic device 3, a front layer 41 which is adhered the backsheet 5 and an intermediate layer 42 between the back layer 43 and the front layer 41.

TABLE 1

| Type | Purpose | MFR (2.16 kg/ 190° C.) | Density (kg/m3) | Concentration (wt %) |
|---|---|---|---|---|
| VLDPE1 | Linear Low density Polyethylene | 28 ± 5 | 880 ± 5 | |
| VLDPE2 | Linear Low density Polyethylene | 28 ± 5 | 900 ± 5 | |
| VLDPE3 | Linear low Density Polyethylene | 6 ± 2 | 880 ± 5 | |
| Trigonox 311 in VLDPE1 | Peroxide for grafting | | | 10 |
| TBEC (tert-Butylperoxy 2-ethylhexyl carbonate) in VLDPE1 | Peroxide for crosslinking | | | 10 |
| TAIC (triallyisocyanuraat) in VLDPE1 | Crosslinking agent | | | 10 |
| Geniosil XL10 (Vinyltrimethoxysilane) | Grafted material | | | |
| Cyasorb R350-4A | UV stabilization | | | 30 |
| Masterminds PE black 95/1055 | Black pigment | | | |

TABLE 1-continued

| Yparex materials | Description | VTMOS-content (wt %) | MFR (2.16 kg/ 190° C.) | Density (kg/m3) |
|---|---|---|---|---|
| Yparex1 | VLDPE1-g-VTMOS | 3.3 ± 0.5 | 28 ± 5 | 880 ± 5 |
| Yparex2 | VLDPE3-g-VTMOS | 3.3 ± 0.5 | 6 ± 2 | 880 ± 5 |
| Yparex3 | LLDPE-g-MAH | | 2.5 | 933 |
| Yparex4 | VLDPE1-g-VTMOS + 0.75% Cyasorb R350-4A | 3.3 ± 0.5 | 28 ± 5 | 880 ± 5 |

| Backsheets PV | Supplier | Type backsheet |
|---|---|---|
| AAA3554 | Isovoltaic | PA treated-PA-PA (3 layers) |
| TPC3480 | Isovoltaic | Cu-PET-PVF (3 layers) |

| Polymeric material nr. | Films | Layers | Thickness (μm) |
|---|---|---|---|
| S1 (comparative) | Yparex1-VLDPE1-Yparex1 | 3 | 46 + 368 + 46 = 460 |
| S2 (comparative) | Yparex1-VLDPE2-Yparex1 | 3 | 46 + 368 + 46 = 460 |
| S3 | Yparex1-(VLDPE1 + 2% TBEC)-Yparex 1 | 3 | 46 + 368 + 46 = 460 |
| S4 | Yparex1-(VLDPE1 + 1% TBEC + 0.5% TAIC)-Yparex1 | 3 | 46 + 368 + 46 = 460 |
| S5 (comparative) | Yparex1 | 1 | 230 |
| S6 (comparative) | Yparex3 | 1 | 25 |
| S7 (comparative) | DOW Enlight XUS 66232.00 | 1 | 457 |
| S8 | Yparex1-(VLDPE1 + 1% TBEC + 0.5% TAIC + 0.75% Cyasorb R350-4A)-Yparex1 | 3 | 46 + 368 + 46 = 460 |
| S9 | Yparex4-(VLDPE1 + 1% TBEC + 0.5% TAIC + 0.75% Cyasorb R350-4A)-Yparex4 | 3 | 46 + 368 + 46 = 460 |
| S10 | Yparex1-(VLDPE1 + 1% TBEC + 0.5% TAIC + 0.75% Cyasorb R350-4A + 1.5% Masterminds PE black 95/1055)-Yparex1 | 3 | 46 + 368 + 46 = 460 |

Test Methods

The Si-content was determined according to ISO12677: a polymer sample is pressed to plates with a thickness of 1.8-2 mm in a Fonteijne press using a temperature of 160° C. during 2 minutes. A Philips WDXRF PW2404 spectrometer is calibrated with suitable reference samples. Calibration data are stored in the program PE Si (quantitative). Using the program PE Si (quantitative) the sample is analyzed and the Si-content is calculated. The VTMOS content is calculated from the Si-content: VTMOS (wt %)=Si(wt %)*148.25/28.

MFR was determined according to ISO1133 at 190° C. and 2.16 kg: 4-5 gram polymer sample is introduced in the specially designed MFI apparatus. The apparatus consists of a small die inserted into the apparatus, with the diameter of the die generally being around 2 mm. The material is packed properly inside the barrel to avoid formation of air pockets. A piston is introduced which acts as the medium that causes extrusion of the molten polymer. The sample is preheated for a specified amount of time: 5 min at 190° C. After the preheating a weight of 2.16 kg is introduced onto the piston. The weight exerts a force on the molten polymer and it immediately starts flowing through the die. A sample of the melt is taken after a desired period of time and is weighed accurately. MFI is expressed as grams of polymer/10 minutes of total time of the test. Synonyms of Melt Flow Index are Melt Flow Rate and Melt Index. More commonly used are their abbreviations: MFI, MFR and MI. Confusingly, MFR may also indicate "melt flow ratio", the ratio between two melt flow rates at different gravimetric weights. More accurately, this should be reported as FRR (flow rate ratio), or simply flow ratio. FRR is commonly used as an indication of the way in which rheological behavior is influenced by the molecular mass distribution of the material.

Density was determined according to ISO1183: the specimen is weighed in air, and subsequently weighed when immersed in distilled water at 23° C. using a sinker and wire to hold the specimen completely submerged as required. The density is calculated according to the guidelines given in the ISO method. The specimen size can be any convenient size.

Optical properties were determined according to ASTM D1003: transmission is defined as the percent of incident light that is able to pass through a material. The higher the transmission value, the more transparent a material is. Haze is defined as the percent of transmitted light that is scattered more than 2.5° from the direction of the incident beam. Materials with haze values greater than 30% are considered diffused. Testing is performed in either a Hazemeter (Procedure A) or a Spectrophotometer (Procedure B). In both cases, light passes through the test specimen on its way to a photo detector. When Hazemeter and Spectrophotometer values are not consistent, the Hazemeter values take precedence.

Peel strength measurement example 2: the peel strength was determined using the following test set-up: Machine: Zwick Z050; Control & analysis: Zwick software TestXpert II; Load-cell: 2 kN cell; Displacement: Bench displacement; Grips fixture: 10 kN manual grip; Test speed: 100 mm/min; Test conditions: 23° C. & 50% R.H. The sample is clamped on the test set-up under a 45° angle. Approximately 15 mm foil is then clamped in the grip. After the pre-load is reached the machine moves with a constant speed and peels the foil from the glass, keeping an angle around 90° (depending on the stiffness of the foil).

Peel strength measurement example 3 and 4: the peel strength was determined using a 90° peel test, based on ASTM D 6862-04. Lower linear speeds (ca. 30 mm/min) were used though, whereas linear speed proposed in the standard is 250 mm/min. A lower speed makes testing more time consuming, but provides more detailed and reliable data. 3 strips of 0.5-1 cm width (depending on peel force to be applied) were measured.

Example 1

Preparation of silane grafted very low density polyethylene (Yparex1 and Yparex2).

Two types of very low density polyethylene were grafted in an W&P ZSK40 extruder with vinyl trimethoxy silane. In the twin screw extruder the raw materials were fed to the hopper. A peroxide masterbatch (MB, 10% Trigonox 311 in VLDPE1) was also fed to the hopper. Liquid vinyl trimethoxysilane (VTMOS) was dosed by a pump to the molten polymer via a valve attached to the twin screw extruder.

Experimental Details:
Output: 57.5 kg/h
Screw speed: 430 rpm
Torque: 40%
Temperature melt: 250° C.
Temperature reaction zone: 260° C.
Temperature end reaction zone: 280° C.
Die temperature: 310° C.
Two strands 4 mm
Cooling water temperature: 7.5° C.
Peroxide MB dosed to VLDPE1: 2.2 wt %
Peroxide MB dosed to VLDPE3: 2.5 wt %
VTMOS dosed to VLDPE1: 3.85 wt %
VTMOS measured in the grafted VLDPE1 by XRF: 3.63 wt %
VTMOS dosed to VLDPE3: 4 wt %
VTMOS measured in the grafted VLDPE3 by XRF: 3.7 wt %
MFR measured for grafted VLDPE1: 25 g/10 min (190° C. 2.16 kg)
MFR measured for grafted VLDPE3: 7 g/10 min (190° C. 2.16 kg)

Example 2

One layer film production and evaluation.

Film S5 (VLDPE1 grafted with 3.6 wt % vinyl trimethoxy silane (Yparex1) according to example 1) was produced on a Dr. Collin 300 mm wide cast film line. Yparex1 was processed at 120° C. After production the film was stored in an Aluminum-lined sealed bag.

As comparative materials Film S6 (MAH grafted LLDPE (Yparex3)) and S7 (DOW Enlight) were tested. Film S6 (LLDPE grafted with MAH (Yparex 3)) was produced on a 30 cm wide cast film line. Yparex3 was processed at 200° C.

The films S5-S7 were laminated on patterned SM glass, if necessary more than one layer was used. A film thickness of 400-460 micrometer was achieved by using a Teflon-film as spacer. Samples were laminated at 150° C. during a total time of 1400 seconds. Vacuum was 0.4 bar and pressure was 30 kN.

The peel strength and optical properties were measured. The results are shown in table 2.

TABLE 2

| Comparative Experiment | Polymeric Material | Peel strength (N/mm) | Optical properties | |
|---|---|---|---|---|
| | | | Transmission % | Haze % |
| A | S5 | 1.5 | 90.7 | 19.2 |
| B | S6 | <0.1 | 74.1 | 99 |
| C | S7 | 1.2 | 88.1 | 76 |

The results in Table 2 show that the polymeric material S5 has, in comparison with the other two materials, a good peel strength and superior optical properties (high transmission and very low haze).

Example 3

Three layer coextruded film production and evaluation.

On a Dr. Collin 300 mm wide cast film line three layer films were produced with the following dimensions:

Films (S1-S4) were prepared with a first (outer) layer of 46 μm, a second (inner) layer of 368 μm and a third (outer) layer of 46 μm. The films were processed at 120° C. After production, films were stored in Aluminum-lined sealed bags. The two outer layers (1 and 3) comprise Yparex 1 prepared according to example 1. The inner layer (2) is varied.

The films were laminated between glass and a backsheet (25 minutes cycle, of which 18 minutes at 155° C.). The adhesion of the four different polymeric materials on the backsheets AAA3554 and TPC3480 was tested. Also transmission and haze of the films have been determined. The results are shown in Table 3.

TABLE 3

| Ex. | Polymeric Material | Peel strength directly after lamination | | Peel strength after thermal cycle test (100 cycles −40° C. to 90° C.) | | Optical properties |
|---|---|---|---|---|---|---|
| | | Cu (N/cm) | PA (N/cm) | Cu (N/cm) | PA (N/cm) | Transmission |
| CE 3.1 | S1 | >100 | >100 | >100 | 80-100 | 00 |
| CE 3.2 | S2 | 40-60 | >100 | 40-60 | 10-30 | 0 |
| 3.3 | S3 | 40-80 | >100 | 50-90 | 70-120 | 000 |
| 3.4 | S4 | 30-50 | >100 | 30-60 | 50-90 | 000 |

Transmission: 0 = bad
00 = medium
000 = good to excellent

The results in Table 3 show that all polymeric materials have a good adhesion, and especially S3 and S4 have a good to excellent transmission. Furthermore the adhesion after thermal cycle test stays on a very high level, which means that the polymeric material will be stable in the applications like photovoltaic cells.

Example 4

The adhesion of four different polymeric materials against a Cu-containing sheet was tested. The tests performed were the damp-heat test and the thermic cycle test. In the damp-heat test according to IEC 60068-2-78:2001 the polymeric materials were placed in an environment of 80° C. and 85% relative humidity (RH). The adhesion (peel strength) of the polymeric material was determined after 500 and 1000 hours in this environment.

In the thermal cycle test according to JIS C-8917 or JIS C-8938 the Cu-containing sheet with the polymeric material adhered to it was cooled to −40° C. and thereafter heated to 90° C. The adhesion (peel strength) was determined after 100 and 200 cycles. The results of these tests are given in Table 4.

TABLE 4

| Ex. | Sealant | Peel Strength (N/cm) DH 0 | DH 500 | DH 1000 | TC 0 | TC 100 | TC 200 | Optical properties Transmission directly after production | Optical properties Transmission after 5 years | Mechanical stability Creep (expected performance) |
|---|---|---|---|---|---|---|---|---|---|---|
| CE 4.1 | S1 | 100 | 90 | Nd | 100 | 100 | Nd | 00 | 00 | Bad |
| CE 4.2 | S2 | 50 | 100 | Nd | 50 | 50 | Nd | 0 | 0 | Medium |
| 4.3 | S3 | 60 | 50 | Nd | 60 | 70 | Nd | 000 | 000 | Good |
| 4.4 | S4 | 60 | 75 | 73 | 60 | 100 | 60 | 000 | 000 | Excellent |
| 4.5 | S8 | 58 | 21 | 12 | 58 | 67 | 71 | 000 | 000 | Excellent |
| 4.6 | S9 | 38 | 9 | 4 | 38 | 41 | 35 | 000 | 000 | Excellent |
| 4.7 | S10 | 53 | 17 | 10 | 53 | 47 | 44 | 000 | 000 | Excellent |
| D | EVA A | 50 | 3 | 2 | 50 | 2 | 3 | 000 | 0 | |
| E | EVA C | 60 | 20 | 2 | 60 | 45 | 50 | 000 | 0 | |

Nd = Not determined

The results in Table 4 show that the polymeric materials S3, S4, S8 and S10 according to the invention have very good initial adhesion (DH 0 and TC 0).

The results in Table 4 show further that the polymeric materials S3, S4, S8 and S10 according to the invention show less loss of adhesion after the DH500 and DH1000 tests when compared to the polymeric materials according to comparative experiments D and E, which contain EVA as comparison polymeric material. EVA is commonly used as the standard polymeric material for solar panels.

Also the adhesion results for polymeric materials S3, S4, S8 and S10 after performance of the TC100 and TC 200 tests were better than for the polymeric materials according to comparative experiments D and E.

The polymeric materials S8 and S10 show a higher initial adhesion (DH 0) compared to polymeric material S9. The polymeric materials S8-S10 comprise a UV absorber. For polymeric material S9 the UV absorber is not only present in the intermediate layer, but also in the back layer and the front layer of the trilayer film structure. After the performance of the DH500 and DH1000 tests, the materials S8 and S10 show higher adhesion when compared to the polymeric material S9. This shows the benefits of addition of a UV absorber to only the inside layer(s) of a multilayer film structure.

The examples S3, S4, S8, S9 and S10 show superior optical properties compared to S1, S2 and both EVA samples; also the mechanical stability (creep) is good to excellent for the examples according to the present invention.

What is claimed is:

1. An electronic device module, comprising:
a glass cover sheet, a polymeric front material, an electronic device, a polymeric back material and a backsheet,
wherein the polymeric front and/or back materials have a trilayer structure comprising a back layer which is adhered to a surface of the electronic device, a front layer which is adhered to the glass cover sheet or the backsheet and an intermediate layer between the back layer and the front layer,
wherein each of the back layer and the front layer comprises an ethylene interpolymer grafted with silane, wherein the ethylene interpolymer grafted with silane has a density of at most 0.905 g/cm$^3$, wherein the density is determined according to ISO1183,
wherein the intermediate layer consists of a non-grafted ethylene interpolymer having a density of at most 0.905 g/cm$^3$, wherein the density is determined according to ISO1183, a UV stabilizer, and optionally one or more additives,
wherein the non-grafted ethylene interpolymer is crosslinked with the aid of a crosslinking initiator and optionally a crosslinking coagent,
wherein the back layer and the front layer comprise no UV stabilizer, and
wherein the ethylene interpolymer grafted with silane of the front layer and the back layer has a melt index of 10-35 dg/min (ASTM D-1238 (190° C.,/2.16 kg)) before crosslinking, and wherein the intermediate layer has a melt index between 10-35 dg/min before crosslinking (ASTM D-1238 (190° C., 216 kg)).

2. The electronic device module according to claim 1, wherein 40-90 vol % of the polymeric front material and/or polymeric back material comprises the intermediate layer and 10-60 vol % of the polymeric front material and/or polymeric back material comprises the back layer and the front layer.

3. The electronic device module according to claim 1, wherein the polymeric front material and/or polymeric back material has a thickness of 100-1000 μm.

4. The electronic device module according to claim 1, wherein the ethylene interpolymer has a 2 percent secant modulus of less than 150 MPa as measured by the procedure of ASTM D-882-02.

5. The electronic device module according to claim 1, wherein the ethylene interpolymer has a Tg of less than −35° C. as measured by differential scanning calorimetry (DSC) using the procedure of ASTM D-3418-03.

6. The electronic device module according to claim 1, wherein the crosslinking initiator is a peroxide.

7. The electronic device module according to claim 1, wherein the crosslinking coagent is triallyl cyanurate or triallyl isocyanurate.

8. The electronic device module according to claim 1, wherein the silane is selected from the group consisting of vinyl triethoxy silane, vinyl trimethoxy silane, (meth)acryloxy propyl trimethoxy silane and mixtures of these silanes.

9. The electronic device module according to claim 1, wherein the electronic device is a photovoltaic element.

* * * * *